United States Patent
Misra et al.

(10) Patent No.: US 11,798,808 B1
(45) Date of Patent: Oct. 24, 2023

(54) METHOD OF CHEMICAL DOPING THAT USES CMOS-COMPATIBLE PROCESSES

(71) Applicant: National Technology & Engineering Solutions of Sandia, LLC, Albuquerque, NM (US)

(72) Inventors: Shashank Misra, Albuquerque, NM (US); Daniel Robert Ward, Calabasas, CA (US); DeAnna Marie Campbell, Albuquerque, NM (US); Tzu-Ming Lu, Albuquerque, NM (US); Scott William Schmucker, Albuquerque, NM (US); Evan Michael Anderson, Albuquerque, NM (US); Andrew Jay Leenheer, Albuquerque, NM (US); Jeffrey Andrew Ivie, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 355 days.

(21) Appl. No.: 17/360,284

(22) Filed: Jun. 28, 2021

Related U.S. Application Data

(60) Provisional application No. 63/055,079, filed on Jul. 22, 2020.

(51) Int. Cl.
*H01L 21/223* (2006.01)

(52) U.S. Cl.
CPC .................... *H01L 21/223* (2013.01)

(58) Field of Classification Search
CPC .............. H01L 21/041; H01L 21/0415; H01L 21/2225; H01L 21/2252; H01L 21/223
See application file for complete search history.

(56) References Cited

U.S. PATENT DOCUMENTS

| | | | | |
|---|---|---|---|---|
| 5,858,865 | A * | 1/1999 | Juengling | H10B 12/485 257/E21.507 |
| 9,525,045 | B1 * | 12/2016 | Lee | H01L 29/66734 |
| 2002/0022354 | A1 * | 2/2002 | Furukawa | H01L 21/28061 257/E21.258 |
| 2002/0160627 | A1 * | 10/2002 | Kunz | H01L 31/1804 438/479 |
| 2003/0077886 | A1 * | 4/2003 | Machida | H01L 21/2236 257/E21.143 |
| 2008/0135878 | A1 * | 6/2008 | Kim | H01L 29/78 257/E21.409 |

(Continued)

OTHER PUBLICATIONS

Ward et al. ("All-optical lithography process for contacting atomically-precise devices," arXiv: 1708.05411, [physics.app-ph], 5 pages, Aug. 8, 2017). (Year: 2017).*

(Continued)

*Primary Examiner* — Andres Munoz
(74) *Attorney, Agent, or Firm* — Martin I. Finston; Mark A. Dodd

(57) ABSTRACT

A method of Atomic Precision Advanced Manufacturing (APAM) is provided, in which a substrate is doped from a dopant precursor gas. The method involves covering a surface of the substrate with a hard mask, selectively removing material from the hard mask such that selected areas of the substrate surface are laid bare, exposing the laid-bare areas to the dopant precursor gas, and heating the substrate so as to incorporate dopant from the dopant precursor gas into the substrate surface.

18 Claims, 9 Drawing Sheets

(56) References Cited

U.S. PATENT DOCUMENTS

| | | | | |
|---|---|---|---|---|
| 2010/0120240 A1* | 5/2010 | Rouh | ............... | H01L 21/823842 |
| | | | | 257/E21.409 |
| 2010/0289032 A1* | 11/2010 | Zhang | ................. | H01L 29/0657 |
| | | | | 257/77 |
| 2013/0078774 A1* | 3/2013 | Jang | ...................... | H01L 21/223 |
| | | | | 257/E21.409 |

OTHER PUBLICATIONS

Fuechsle, M. et al., "A Single-Atom Transistor," Nature Nanotechnology, 2012, vol. 7, pp. 242-246.

Keith, D. et al., "Single-Shot Spin Readout in Semiconductors Near the Shot-Noise Sensitivity Limit," Physical Review X, 2019, vol. 9, pp. 041003-1-041003-11.

He, Y. et al., "A Two-Qubit Gate between Phosphorus Donor Electrons in Silicon," Nature, 2019, vol. 571, pp. 371-375.

Koch, M. et al., "Spin Read-Out in Atomic Qubits in an All-Epitaxial Three-Dimensional Transistor," Nature Nanotechnology, 2019, vol. 14, pp. 137-140.

Ward, D. R. et al., "Atomic Precision Advanced Manufacturing for Digital Electronics," Electronic Device Failure Analysis, 2020, vol. 22, pp. 4-11.

Shen, T.-C. Shen et al., "Atomic-Scale Desorption through Electronic and Vibrational Excitation Mechanisms," Science, 1995, vol. 268, pp. 1590-1592.

Schofield, S. R. et al., "Atomically Precise Placement of Single Dopants in Si," Physical Review Letters, 2003, vol. 91, pp. 136104-1-136104-4.

Oberbeck, L. et al., "Measurement of Phosphorus Segregation in Silicon at the Atomic Scale using Scanning Tunneling Microscopy," Applied Physics Letters, 2004, vol. 85, pp. 1359-1361.

Ward, D. R. et al., "All-Optical Lithography Process for Contacting Nanometer Precision Donor Devices," Applied Physics Letters, 2017, vol. 111, 193101-1-193101-5.

Skeren, T. et al., "CMOS Platform for Atomic-Scale Device Fabrication," Nanotechnology, 2018, vol. 29, 435302, 9 pages.

Katzenmeyer, A. M. et al., "Photothermal Alternative to Device Fabrication using Atomic Precision Advanced Manufacturing Techniques," Proc. of SPIE Advanced Lithography, 2020, vol. 11324, Novel Patterning Technologies for Semiconductors, MEMS/NEMS and MOEMS 2020, pp. 113240Z-1-113240Z-9.

Anderson, E. M et al., "Low-Temperature Silicon Epitaxy for Atomic Precision Devices," ECS Transactions, 2019, vol. 93, pp. 37-40.

Anderson, E. M. et al., "Low Thermal Budget High-k/Metal Surface Gate for Buried Donor-Based Devices," SAND2020-5994J, Sandia National Laboratories (Jun. 2020), 28 pages.

Ward, D. R. et al., "CMOS Compatible Atomic-Precision Donor Devices," ECS Meeting Abstracts, vol. MA2020-01, 237th ECS Meeting, May 10, 2020, Meet. Abstr. MA2020-01 1384.

\* cited by examiner

METHOD OF CHEMICAL DOPING THAT USES CMOS-COMPATIBLE PROCESSES

CROSS-REFERENCE TO RELATED APPLICATION

This application claims priority to U.S. Provisional Application Ser. No. 63/055,079, filed Jul. 22, 2020 under the title, "A Method of Chemical Doping that Uses CMOS-Compatible Processes", the entirety of which is hereby incorporated herein by reference.

ACKNOWLEDGEMENT OF GOVERNMENT SUPPORT

This invention was made with United States Government support under Contract No. DE-NA0003525 between National Technology & Engineering Solutions of Sandia, LLC and the United States Department of Energy/National Nuclear Security Administration. The United States Government has certain rights in this invention.

FIELD OF THE INVENTION

This invention relates to atomic scale manufacturing techniques for applications in the fabrication of semiconductor devices.

ART BACKGROUND

Alternative semiconductor manufacturing technologies are gaining more and more attention. This is due, in part, to the increasing recognition that device miniaturization by conventional approaches may be approaching its limits. Meanwhile, interest is growing in novel structures for use in quantum computing and other emerging applications. Enhanced doping techniques that exceed ordinary solubility limits, for example, can create electrical characteristics and optical responses that are qualitatively different from those that silicon exhibits at conventional levels of doping.

Atomic Precision Advanced Manufacturing (APAM) is a new fabrication technology that shows promise in this regard. Another term for APAM is "Atomic Scale Manufacturing".

APAM processing begins with a substrate surface, typically a silicon surface. The substrate surface is passivated with an atomic-layer hydrogen resist. The passivated surface is exposed to dopants in the form of a precursor gas. Dopants are selectively incorporated into the surface. The sites where incorporation takes place are selected by using a scanning tunneling microscope (STM) to remove resist from the surface. At the selected spots, precursor molecules adsorb to the silicon surface, where they are thermally decomposed and diffused into the silicon surface.

APAM processes are receiving active attention in the technical literature. The following technical articles, the entirety of each of which is hereby incorporated herein by reference, may be of interest in this regard:

M. Fuechsle, J. A. Miwa, S. Mahapatra et al., "A single-atom transistor," Nature Nanotechnology, 7(4), 242-246 (2012);

D. Keith, M. G. House, M. B. Donnelly et al., "Single-Shot Spin Readout in Semiconductors Near the Shot-Noise Sensitivity Limit," Physical Review X, 9(4), (2019);

Y. He, S. K. Gorman, D. Keith et al., "A two-qubit gate between phosphorus donor electrons in silicon," Nature, 571(7765), 371-375 (2019);

M. Koch, J. G. Keizer, P. Pakkiam et al., "Spin read-out in atomic qubits in an all-epitaxial three-dimensional transistor," Nature Nanotechnology, 14(2), 137-140 (2019);

D. R. Ward, S. W. Schmucker, E. M. Anderson et al., "Atomic Precision Advanced Manufacturing for Digital Electronics," Electronic Device Failure Analysis, 22(1), 4-11 (2020);

T. C. Shen, C. Wang, G. C. Abeln et al., "Atomic-Scale Desorption through Electronic and Vibrational-Excitation Mechanisms," Science, 268(5217), 1590-1592 (1995);

S. R. Schofield, N. J. Curson, M. Y. Simmons et al., "Atomically precise placement of single dopants in Si," Physical Review Letters, 91(13), (2003);

L. Oberbeck, N. J. Curson, T. Hallam et al., "Measurement of phosphorus segregation in silicon at the atomic scale using scanning tunneling microscopy," Applied Physics Letters, 85(8), 1359-1361 (2004);

D. R. Ward, M. T. Marshall, D. M. Campbell et al., "All-optical lithography process for contacting nanometer precision donor devices," Applied Physics Letters, 111(19), (2017); and T. Skeren, N. Pascher, A. Garnier et al., "CMOS platform for atomic-scale device fabrication," Nanotechnology, 29(43), (2018).

APAM using an STM tip has the potential to be templated with atomic precision. It also has the potential to achieve active dopant concentrations beyond the solid solubility limit in silicon. However, STM patterning is prohibitively slow for most applications, is limited to small areas (typically, 12 μm×12 μm spots), and has no known route for mass parallelization.

APAM techniques may offer value even for applications that do not require atomic precision. Examples include plasmonic devices and microelectronics using enhanced doping, such as high-conductivity transistor contacts. However, there is a need for patterning over larger areas than those attainable with STM, and there is a need for a viable path to manufacturability.

Accordingly, there is a need for new extensions of the APAM approach that are scalable, that can be massively parallelized, and that are fully compatible with CMOS manufacturing processes.

SUMMARY OF THE INVENTION

Currently, a typical STM-based implementation of APAM is performed in ultrahigh vacuum (UHV) on a Si(100) substrate with a thin oxide layer. The following steps are typical: (a) The sample is heated to degas adsorbates; (b) the sample is bombarded with cracked hydrogen to further clean the surface; (c) the sample is heated to desorb surface oxide and reveal an atomically clean silicon surface; (d) dangling bonds on the silicon surface are passivated by hydrogen exposure; (e) the STM tip is used lithographically to selectively remove hydrogen, resulting in chemically reactive dangling bonds; (f) phosphine (PH3) exposure results in selective adsorption of phosphine on patterned areas, which is followed by decomposition of the phosphine to release phosphorus (P) onto the silicon surface; (g) the sample is heated to incorporate P substitutional impurities into the silicon lattice so that they constitute an electrically active dopant; (h) the silicon surface is encapsulated by a silicon overlayer; and (i) electrical contacts are made to the patterned area.

In the process outlined above, annealing at temperatures low enough to leave the hydrogen resist mask intact has been found sufficient to partially incorporate the phosphorus dopants into the lattice. The subsequent encapsulation step is performed at temperatures low enough to prevent diffusion of the dopants.

For applications in manufacturing, it is noteworthy that the APAM process as described above is thermally compatible for inclusion between the high-temperature process steps associated with front-end-of-line microelectronics manufacturing, and the low-temperature process steps associated with back-end-of-line.

In the above process, the STM can selectively depassivate hydrogen attached to the atomically clean Si(100) surface with sub-nanometer precision. (See, e.g., T. C. Shen et al. (1995), cited above.) However, the hydrogen depassivation lithography is the main roadblock that prevents the scaling of this process up to wafer scale.

That is, wafer-scale tools are available for the initial sample preparation and hydrogen termination. Those could be achieved, for example, within a low-pressure chemical vapor deposition tool (LPCVD). Wafer-scale tools are also available for the precursor dosing and the low-temperature silicon encapsulation. Those could be achieved, e.g., with a molecular beam epitaxy system and a doping antechamber. But the time needed for the STM to depassivate the hydrogen could be prohibitive. That is, even at the scale of a single device on one chip, the time required for the STM-based depassivation may be as much as a full day.

In place of the STM-based patterning of an atomic-layer resist, then, it would be desirable to find an alternative that is practical at wafer scale and still offers at least some of the benefits of APAM processing.

In conventional semiconductor processing, lithography using a mask is an established technique for rapid and parallel processing over large wafer areas. We have developed a new technique that uses a lithographically patterned mask to select the regions of the substrate surface for doping from a precursor gas in accordance with APAM techniques described above. In that way, our new technique offers a path to practical wafer-scale manufacturing that preserves at least some of the benefits of APAM processing.

In our new technique, a patterned mask prevents the dopant precursor from bonding with the silicon surface. In examples, the mask is a silicon oxide mask. It may be patterned, for example, by photolithography, even at the highest resolutions that are available.

Although the dopant could potentially interact with the mask oxide, such interaction would be inconsequential because it would not result in electrical activation of the dopant. Consequently, the silicon surface will contain electrically activated dopants only in exposed regions, i.e., in those regions that are not covered by oxide.

Our new technique is highly scalable and can leverage standard CMOS process to enable patterning of an APAM device.

Accordingly, the invention relates to a method of APAM processing in which a substrate is doped from a dopant precursor gas. A "gas" in this regard is any volatile compound that can be used in the vapor phase for the doping process. The substrate may be a wafer, layer, or any other suitable body made of any covalently bonded solid. In the illustrative embodiment described below, the substrate material is silicon. Other nonlimiting examples of possible substrate materials include germanium, germanium-silicon alloys, III-V compounds such as gallium arsenide, indium arsenide, indium phosphide, and gallium nitride, and diamond.

The method involves covering a surface of the substrate with a hard mask, selectively removing material from the hard mask such that selected areas of the substrate surface are laid bare, exposing the laid-bare areas to the dopant precursor gas, and heating the substrate so as to incorporate dopant from the dopant precursor gas into the substrate surface. A "hard mask" in this regard is an organic or inorganic film that is resistant to etching in an oxygen-rich or halogen-rich plasma. Typically, but with possible exceptions, hard masks are deposited by a CVD or spin-on process.

In embodiments, a cap layer of silicon is epitaxially deposited over the substrate after dopant has been incorporated into the substrate surface. Before depositing the cap layer, a locking layer may be formed by deposition followed by recrystallization, to suppress out-diffusion of the dopant from the layer where it has been incorporated.

In embodiments, the hard mask that covers the substrate surface has regions of greater thickness, here denominated thick regions, and regions of lesser thickness, here denominated thin regions.

In embodiments, in the step of selectively removing material, the substrate surface is laid bare beneath the thin regions but remains covered by the hard mask in the thick regions.

In embodiments the thick and thin regions are defined by lithographic patterning before material is selectively removed from the hard mask.

In embodiments, to cover a substrate surface with a hard mask, a first hard mask layer is formed. Material is selectively removed from the first hard mask layer from regions designated as thin regions. Then, a second hard mask layer is formed at least in the thin regions. In some embodiments, the second hard mask layer is oxidatively grown.

In various embodiments, the hard mask covering a surface of the substrate comprises silicon dioxide, silicon nitride, or silicon oxynitride.

In embodiments, the hard mask comprises at least two regions having different material compositions, and the selective removal of material from the hard mask is performed, at least in part, with a technique that removes one of the material compositions in preference to one or more other material compositions of the hard mask.

In various embodiments, the dopant is phosphorus incorporated from a precursor gas of phosphine, arsenic incorporated from a precursor gas of arsine, boron incorporated from a precursor gas of diborane or boron trichloride, aluminum incorporated from a precursor gas of alane, aluminum trichloride, trimethylaluminum, or dimethyl aluminum hydride, gallium incorporated from a precursor gas of triethylgallium, or antimony incorporated from a precursor gas of triphenylstibine.

BRIEF DESCRIPTION OF THE DRAWINGS

In FIG. 7, a silicon cap layer is photolithographically patterned and selectively removed from over the thick hard mask regions. In FIG. 8, vias are photolithographically patterned and etched into a silicon wafer. In FIG. 9, bond pads are deposited for electrical contact through the vias to a doped layer.

Upon examining the figure, it is important to note that as intended, the APAM layer has formed only in the region that had underlain the thin oxide mask layer.

Figure 13:
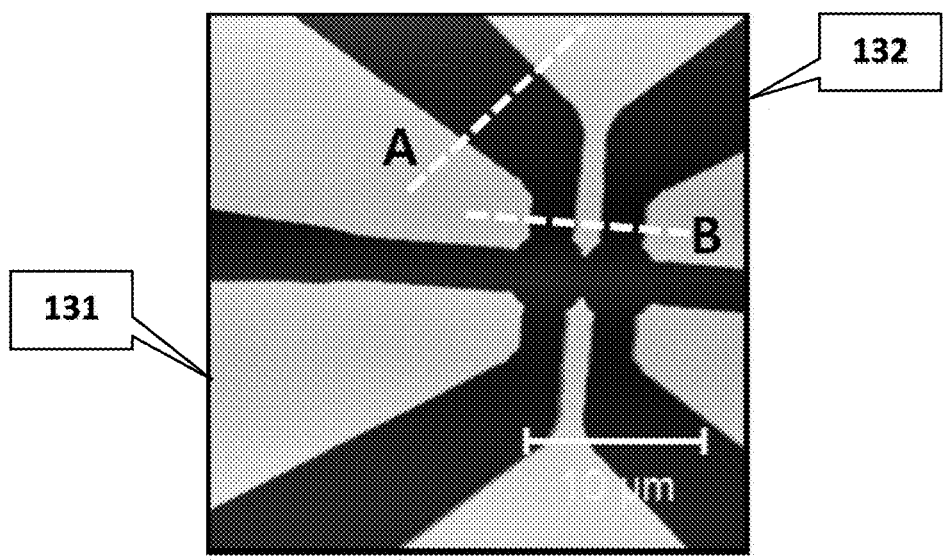

FIG. 13 is an image showing a detail of a Hall measurement circuit at an intermediate stage of fabrication after deposition of the thin oxide but prior to oxide removal and doping. Two straight-line tracks are superimposed on the image. An atomic force microscope (AFM) was used to measure the surface topology of the sample along each of the two tracks. The resulting profilograms are shown in FIGS. 14A and 14B.

Figure 14A:
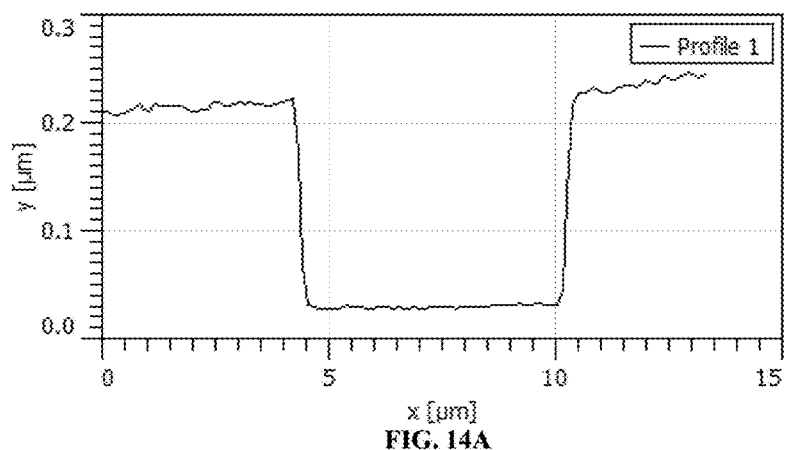
Figure 14B:
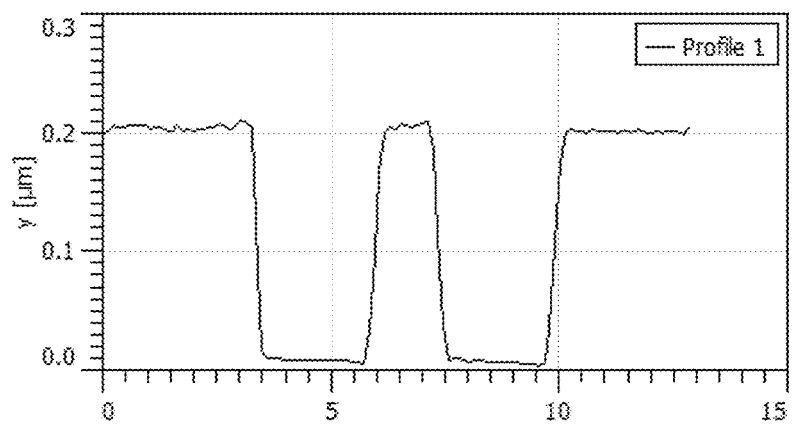

FIGS. 14A and 14B are profilograms of the partially fabricated circuit of FIG. 13.

Figure 15:
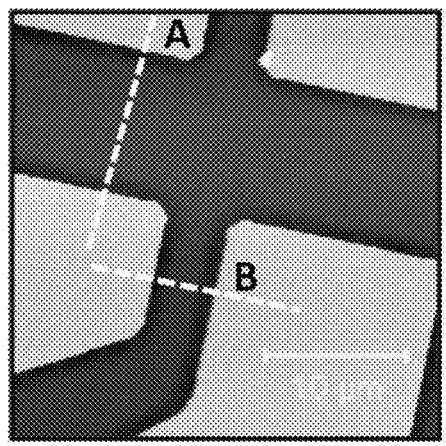

FIG. 15 is an image showing a detail of a Hall measurement circuit after formation of an APAM layer and deposition of a protective silicon cap layer. Two straight-line tracks are superimposed on the image. An atomic force microscope (AFM) was again used to measure the surface topology of the sample along each of the two tracks. The resulting profilograms are shown in FIGS. 16A and 16B.

Figure 16A:
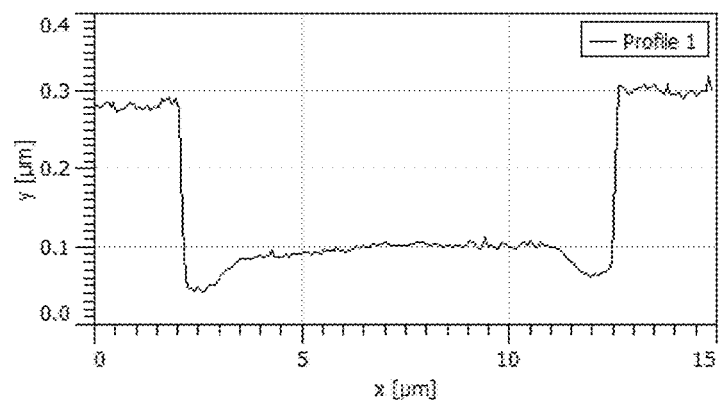
Figure 16B:
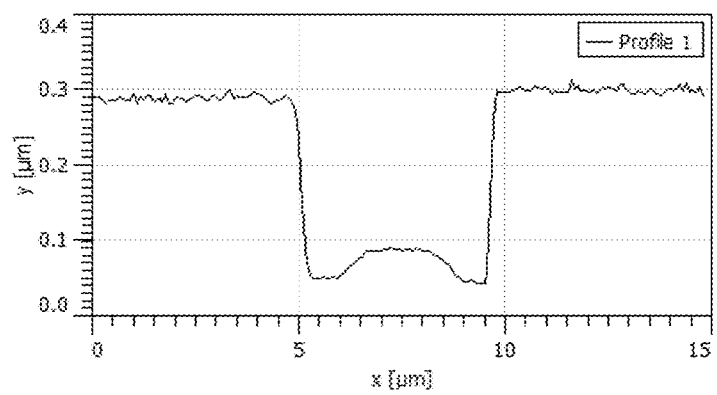

FIGS. 16A and 16B are profilograms of the circuit of FIG. 15.

Figure 17:
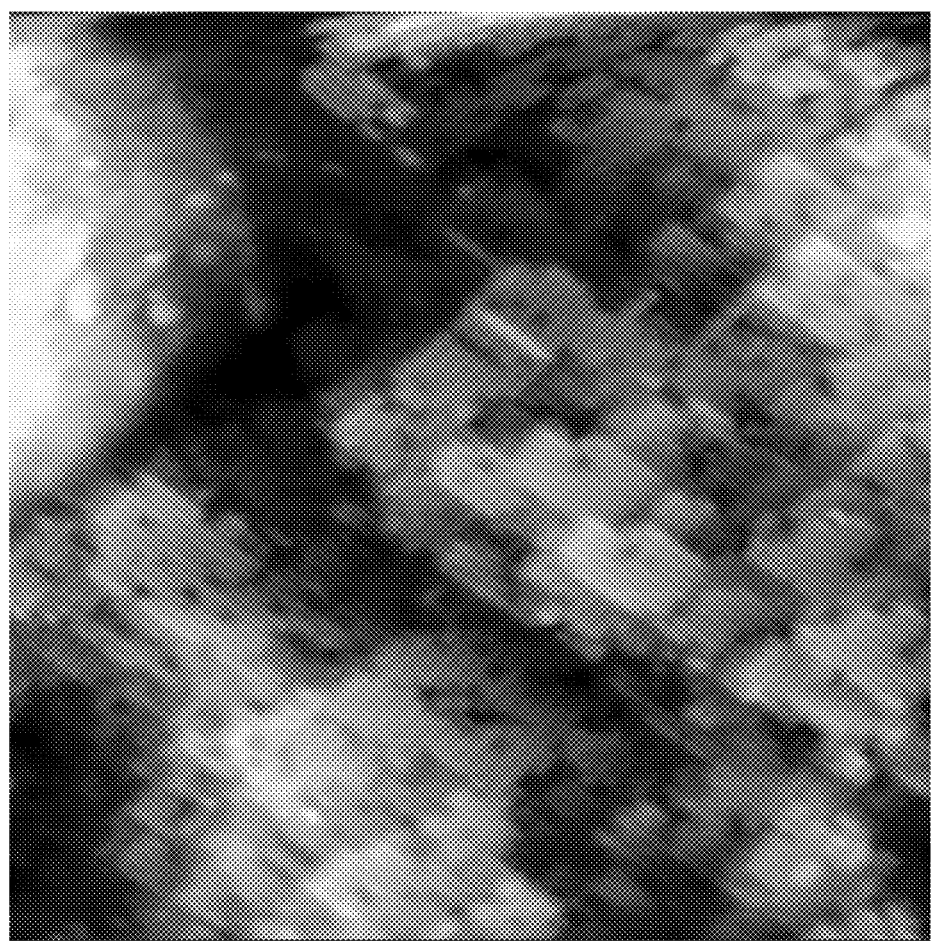

FIG. 17 is an STM topographical image of a silicon surface prepared for APAM doping.

DETAILED DESCRIPTION

APAM is a technique for chemically doped device fabrication. It differs from traditional dopant fabrication techniques in that the dopants are incorporated into the silicon through a chemical bonding process rather than thermal diffusion and activation of dopant atoms.

Although APAM was originally developed for creating dopant-based quantum information devices, it can be adapted to build digital electronic devices. It is of special interest in this regard because it can potentially achieve active dopant concentrations of about 1022 cm-3, which is much higher than possible through conventional CMOS doping techniques.

Figure 1:
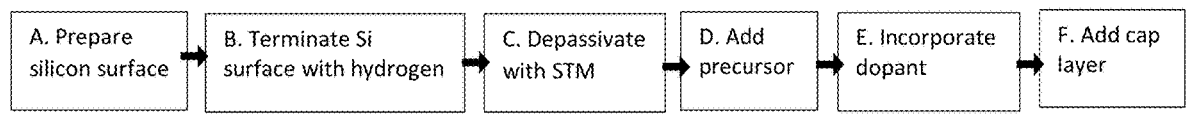
FIG. 1 is a flowchart illustrating a basic sequence of APAM process steps as practiced in the prior art.

FIG. 1 is a flowchart illustrating the basic APAM process steps as practiced in the prior art. As seen in the figure, these steps include: (A) Silicon surface preparation, (B) Hydrogen termination of the silicon surface, (C) Selective depassivation of the hydrogen with STM to remove hydrogen from the silicon surface and create a pattern, (D) Filling of the depassivated silicon with a chemical dopant precursor such as phosphine, (E) Incorporation of the dopant into the silicon lattice, and (F) Capping of the dopant device with silicon to protect the device.

The APAM process is performed in ultra-high vacuum, typically about 10-10 torr. In typical implementations, an unpatterned silicon die is heated to a temperature above 1100° C. to evaporate material from the top surface of the die, leaving pristine silicon. After the dopant has been incorporated, temperatures in excess of 450° C. must be avoided to prevent dopant diffusion.

Historically, these temperature restrictions have been a barrier to integrating APAM with CMOS process flows. A recent article, however, reported that by reducing the surface preparation temperature to 850° C., basic silicon processing could be integrated before the APAM process. That article was published as D. R. Ward et al., "All-optical lithography process for contacting atomically-precise devices," Appl. Phys. Lett. 111, 193101 (2017), the entirety of which is hereby incorporated herein by reference.

Using clean techniques that operate in the 800° C. temperature range, we have found that we can prepare a silicon surface sufficiently clean for the APAM process without disturbing the CMOS FEOL structural elements (which have a thermal budget of at least 850° C.). After fabrication, the APAM devices are viable to 450° C., which provides sufficient thermal budget for BEOL processing using modern CMOS techniques. By selectively opening and capping windows for the APAM device we can protect it from the CMOS BEOL process.

As explained above, APAM as practiced in the prior art uses adsorbed hydrogen to passivate the silicon surface and prevent bonding of the dopant precursor. But in our new technique, a patterned mask is used instead to prevent the dopant precursor from bonding with the silicon surface.

Figure 2:
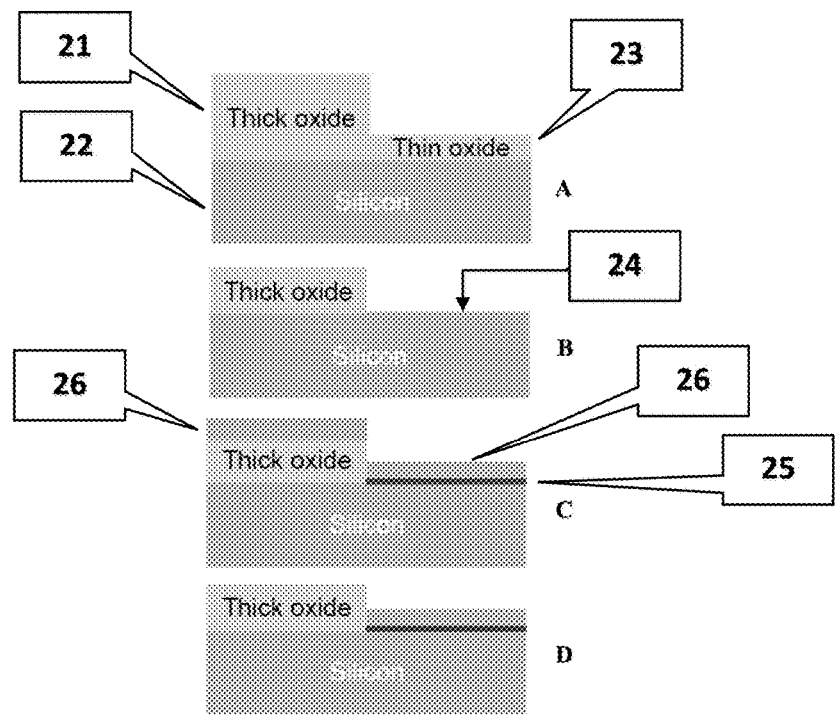
FIG. 2 is a cartoon drawing that notionally illustrates a sequence of steps in a new APAM technique as described herein.

FIG. 2 is a cartoon drawing that notionally illustrates a sequence of steps of our new technique in an illustrative embodiment. As seen in the figure, the silicon substrate is overcoated with a hard mask. The hard mask is labeled "oxide" in the figure because our early trials have used a silicon oxide mask. However, other mask materials may be used, and may even be preferable for certain applications.

Alternate materials include, without limitation, silicon nitride and silicon oxynitride.

For some applications, it could be advantageous to use composite masks with regions having different compositions. For example, a mask could be made with two materials, one sublimating at a lower temperature, and the other sublimating at a higher temperature. The substrate could then be made bare by selectively sublimating one of the two materials.

An example of a composite mask using CMOS-compatible materials could comprise, for example, a layer of silicon dioxide and a layer of silicon nitride. These materials can be selectively etched using different etchants, and they have different sublimation temperatures. Hence, the difference in composition could facilitate the selective removal of, e.g., an overlying layer of one composition, while leaving the lower layer undisturbed.

The steps for creating the hard mask as outlined in FIG. 2 can be carried out by conventional deposition and etch processes. The subsequent processes can be performed, for example, within an atomic layer deposition (ALD) chamber, a molecular beam epitaxy (MBE) chamber, or a chemical vapor deposition (CVD) chamber.

As seen in step (A) of the figure, a thick mask layer 21 overcoats some portions of the substrate 22, but other portions are overlain by a thin mask layer 23. The thin portions of the mask are the portions that overlie substrate regions that are to be doped. At step (B), material is removed from the mask to a depth sufficient to expose the silicon surface 24 in the regions that were overlain by the thin mask layer. At step (C), the exposed silicon is subjected to the dopant precursor gas, the dopant is incorporated in APAM layer 25, and a protective silicon cap layer 26 is blanket deposited. At step (D), the silicon cap is removed from the remaining portions of the thick mask layer.

Figure 3:
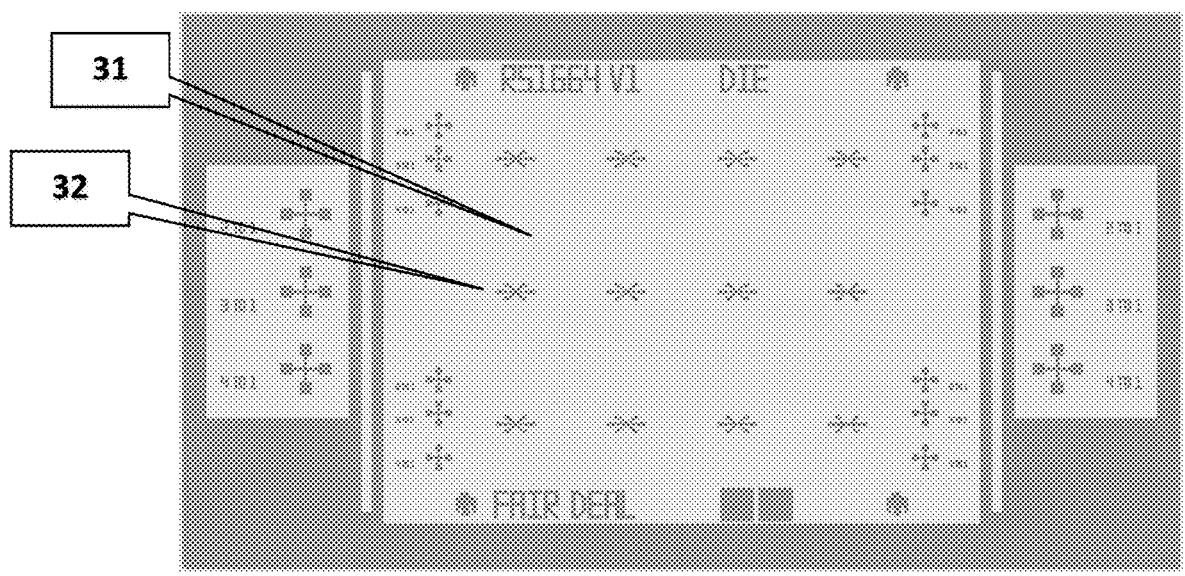
FIG. 3 is a plan view of a die that was fabricated according to an example implementation of our APAM technique.

FIG. 3 is a plan view of a die that was fabricated according to an example implementation of our technique. The die shown in the figure is one of a multiplicity of similar die that were formed by processing a silicon wafer. The white regions 31 in the figure are regions where the silicon surface was overlain by thick oxide and remained undoped. The dark regions 32 were initially overlain by thin oxide and were doped after the thin oxide was removed.

Figure 4:
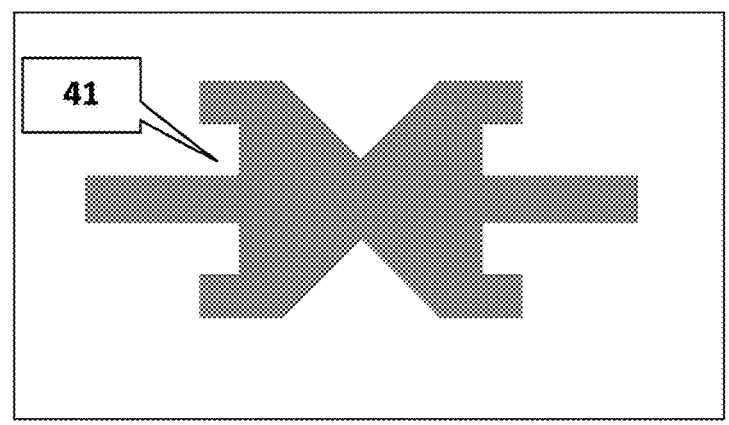
FIG. 4 is a simplified representation of a detail of FIG. 3, showing one individual circuit that was fabricated.

FIG. 4 is a simplified representation of a detail of FIG. 3, showing one individual circuit 41 that was fabricated. The circuit shown is a circuit for Hall (or van der Pauw) measurements of resistance and carrier mobility.

Figure 5A:
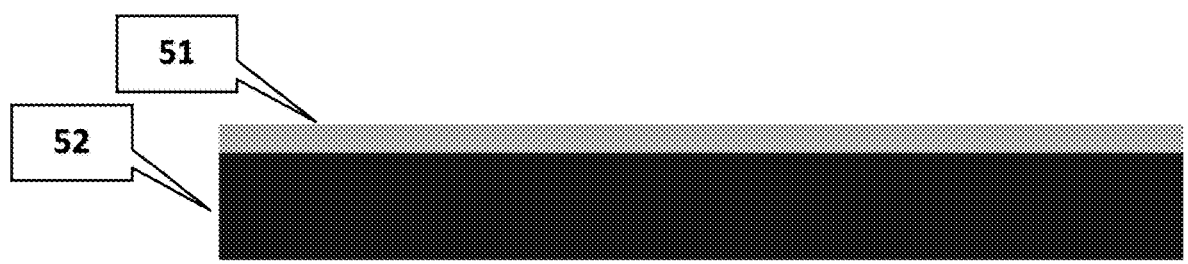
FIGS. 5A-5C illustrate the formation of thick and thin hard mask layers according to an example implementation of our new APAM technique.
Figure 5B:
Figure 5C:
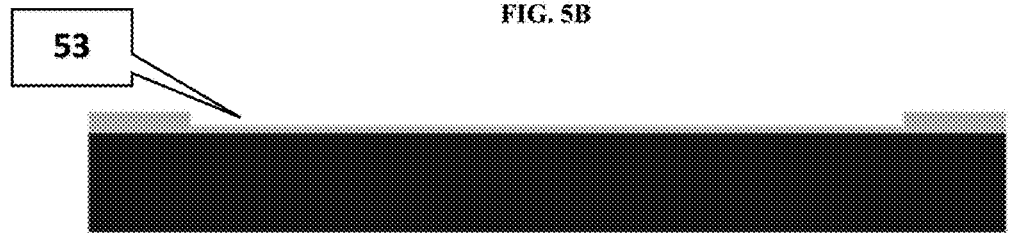

FIGS. 5A-5C illustrate the formation of the thick and thin mask layers in greater detail according to an example implementation.

In FIG. 5A, a thick field oxide 51 is grown on substrate 52 to an example thickness of 2000 Å using a CVD process. In FIG. 5B, the thick field oxide is lithographically patterned, e.g. by photolithography, and in selected areas it is removed down to the bare silicon surface using a 6:1 BOE wet etch. This step defines the circuit regions for the Hall measurements, as well as alignment marks and streets for dicing of the wafer.

In FIG. 5C, a thin gate oxide 53, exemplarily 30 Å thick, is blanket grown using dry oxide in a diffusion furnace at 750° C. The thin oxide layer is grown as a gate oxide in order to provide a high quality interface between the silicon and the oxide in the regions that are to be doped.

Figure 6:
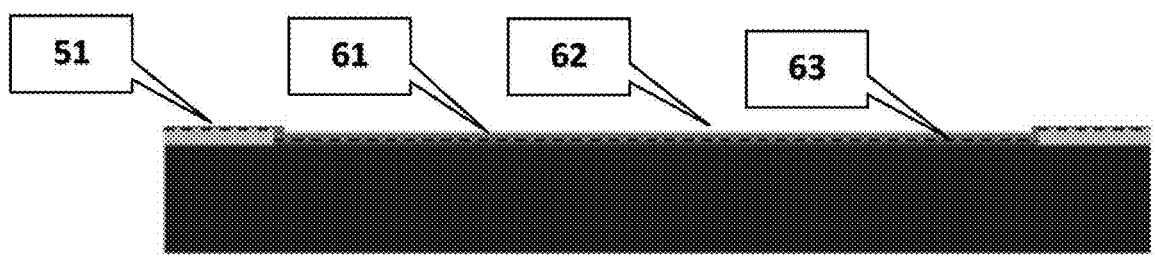
FIGS. 6-9 illustrate sequential stages of our new APAM technique according to an example implementation.

FIG. 6 illustrates the formation of the doped region. Within the APAM tool, which as noted above is exemplarily an ALD, MBE, or CVD chamber, oxide is removed so as to expose the silicon beneath the thin mask layer while incidentally causing some thinning of the thick mask layer 51.

In our early trials, the oxide was removed by thermal heating. Alternative methods, such as etching or sputtering followed by surface recrystallization, may be preferable because they potentially offer more controlled, uniform oxide removal. Typical temperatures for oxide removal by heating were in the vicinity of 800° C. One advantage of alternative methods is that they offer the potential for processing at lower temperatures, which would promote compatibility with conventional CMOS processes.

For example, we found it advantageous to remove oxide by neon sputtering at room temperature, followed by a heating step to recrystallize the sample surface. We found that ion energies of about 2 kV were satisfactory. In trials, we found that ion energies at least in the range 750 V to 2 kV could produce an acceptable silicon surface after recrystallization. In an example offered here for purposes of illustration, we sputtered with neon at 2 kV for 30 minutes at an angle of incidence of 60°. To recrystallize, we heated the sample for 15 minutes to about 300° C., and then heated it to about 650° C. for 15 seconds. As those skilled in the art will recognize, various other protocols for the heating time and temperature may be used instead, and other noble gases may be used in place of neon.

A possible etching method for oxide removal is the well-known hydrogen fluoride (HF) vapor etch. We believe that relatively low processing temperatures can be used with this approach, because after an HF etch, we have obtained at least partial surface recrystallization at a temperature as low as 550° C.

We now turn back to FIG. 6 for the processing after oxide removal. Within the APAM tool, the sample is then exposed to phosphine as the dopant precursor gas. This is typically done at a chamber pressure of $1-2 \times 10-8$ Torr for 20 minutes, delivering a total dose in the range of 12 L-24 L. The partially decomposed precursor gas is thermally incorporated in layer 61 by heating to a nominal temperature of 300° C.-350° C. for 15 minutes.

The sample is then blanket coated with a thin cap layer 62 of silicon, which overlies not only the doped regions, but also the thick mask regions. This is done using a silicon molecular beam epitaxy source, growing 10-30 nm of Si in 20-60 minutes with a substrate temperature near 300° C.-350° C.

Figure 7:
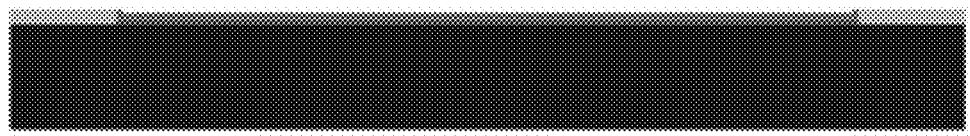

If needed, the silicon cap layer can be photolithographically patterned and selectively removed from over the thick mask regions, as illustrated in FIG. 7, using a reactive ion etch with CF4/Ar at 25° C.

In an optional process variation, a locking layer 63 (FIG. 6) is added after the dopant is thermally incorporated, but before the cap layer is deposited. The locking layer helps to suppress out-diffusion of the dopant from the APAM layer. To form a locking layer, about 2 nm of silicon is deposited without heating the substrate, and then the sample is annealed for recrystallization. In our trials, by way of example, we heated the sample for 15 minutes to about 300° C., and then heated it, to about 600° C. for 15 seconds.

Figure 8:
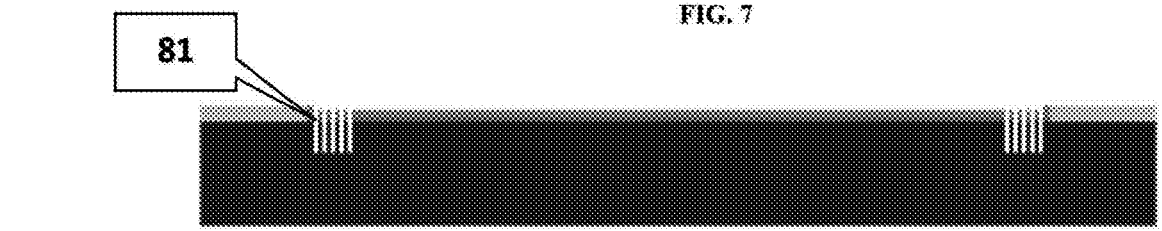

As illustrated in FIG. 8, vias 81, exemplarily 2 μm in diameter, are photolithographically patterned and etched into the silicon to a target depth of 100 nm to make contact to the phosphorus-doped layer, using the same reactive ion etch as above, with CF4/Ar at 25° C.

Figure 9:
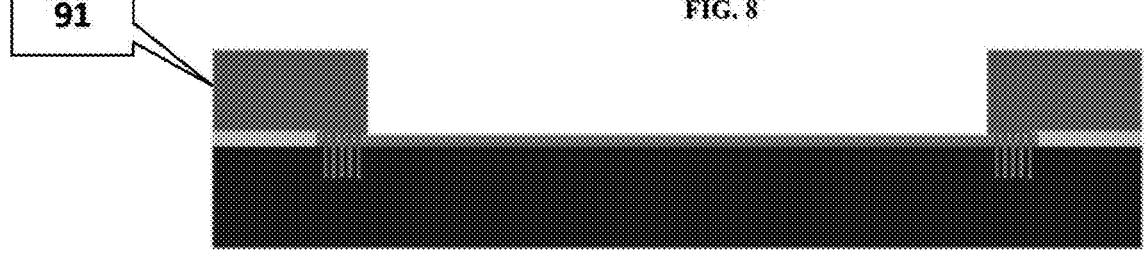

As illustrated in FIG. 9, 300-nm aluminum bond pads 91 are deposited for electrical contact through the vias to the phosphorus-doped layer using a standard metals liftoff process. A 30-sec 100:1 diluted hydrofluoric acid etch is used prior to bond pad deposition to remove any residual oxide in the vias. The wafer is then loaded into an electron-beam metals deposition tool for deposition.

Example 1

We processed a silicon wafer substantially as described above, to fabricate an array of Hall measurement circuits. The purpose of the Hall measurement circuits was to measure the resistivity, carrier mobility, and carrier concentrations in our samples. These measurements were important, among other reasons, to confirm that we were able to achieve the doping levels and electronic behavior that were expected.

Because our circuits performed substantially as expected, we believe that circuits suitable for various practical applications can be made using our techniques.

Examples of APAM-doped circuits suitable for practical applications that can now be made include APAM-based electrodes that enhance metal-semiconductor contact resistance in transistor source/drain regions, plasmonic supply-chain assurance markers, and, more generally, any device element that does not require lateral precision but benefits from a high doping density or an atomically abrupt doping profile in the vertical direction.

Figure 10:
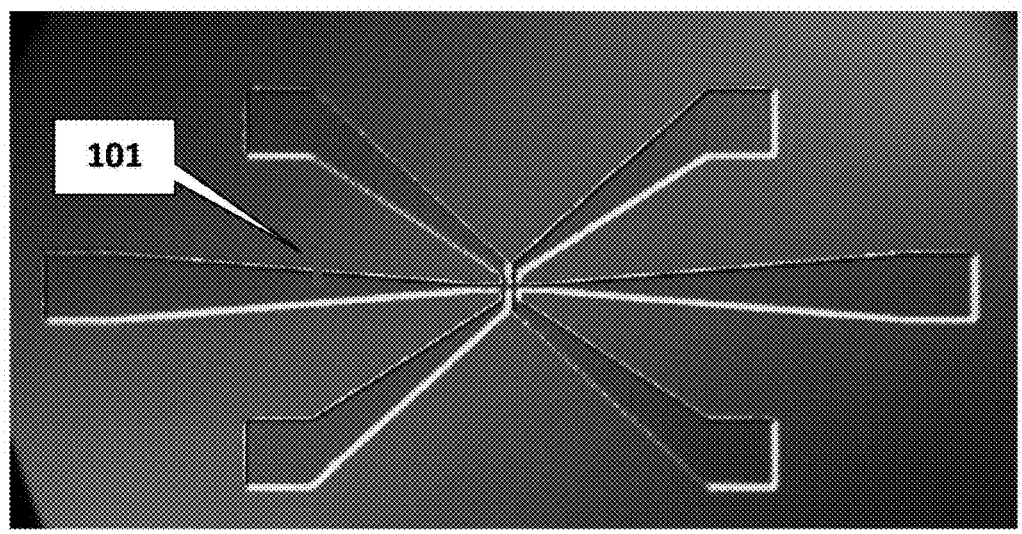
FIG. 10 is based on an optical micrograph of a portion of a wafer at an intermediate stage of fabrication after deposition of thin oxide but prior to oxide removal and doping. A vertical bar in FIG. 10 identifies a particular region of interest.

FIG. 10 is based on an optical micrograph taken at the position of one Hall measurement circuit at an intermediate fabrication stage. The fabrication stage that is shown is after deposition of the thin oxide but prior to oxide removal and doping. Accordingly, the circuit features seen in the figure are covered with several nanometers of silicon oxide, and the surrounding parts of the wafer are covered with the thick oxide.

The vertical bar 101 on the left-hand side of the figure indicates a selected region, including an interface between the thick and thin oxide layers, where transmission electron micrograph (TEM) images were taken. The TEM images are shown in figures discussed below.

Figure 11A:
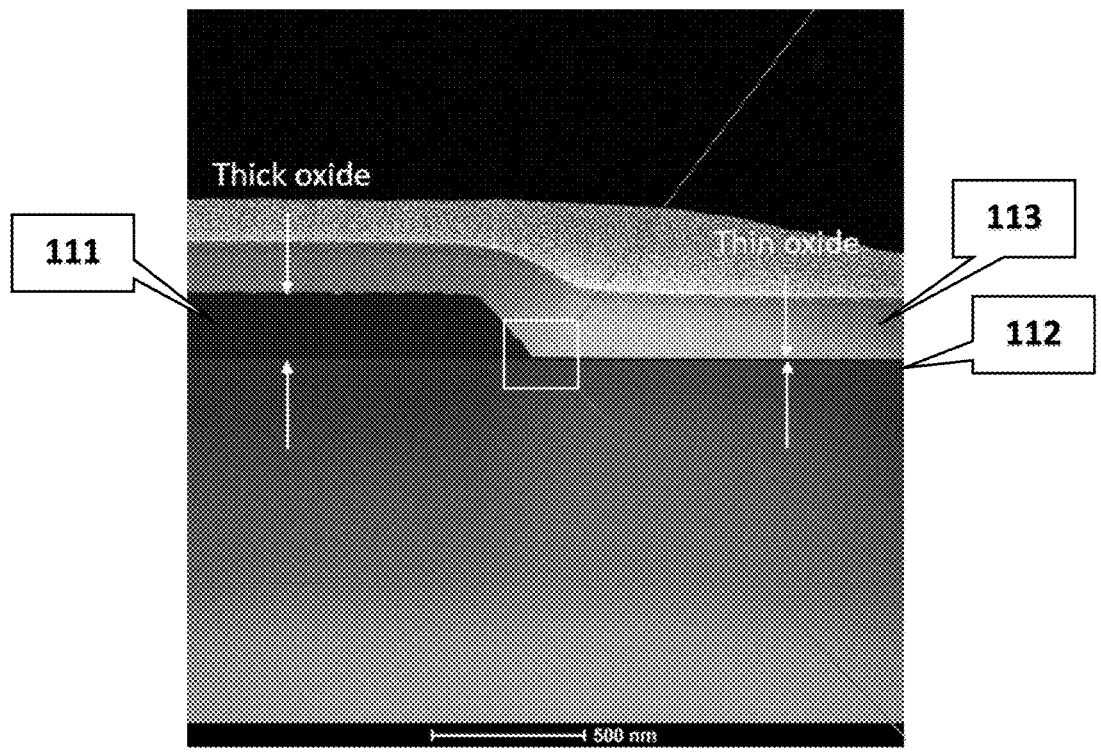
FIG. 11A is a magnified view of the portion of FIG. 10 indicated by the vertical bar. The thick oxide and thin oxide regions are labeled in the figure. A layer of carbon, visible as the lighter-shaded feature overlying the oxide layers, was added for image contrast. A square outline superimposed on the image indicates a region to be shown at greater magnification in a following figure.

FIG. 11A is a magnified view of the portion of FIG. 10 indicated by the vertical bar. The thick oxide 111 and thin oxide 112 regions are labeled in the figure. A layer of carbon, visible as the lighter-shaded feature 113 overlying the oxide layers, was added for image contrast. A square outline superimposed on the image indicates a region to be shown at greater magnification in a following figure.

Figure 11B:
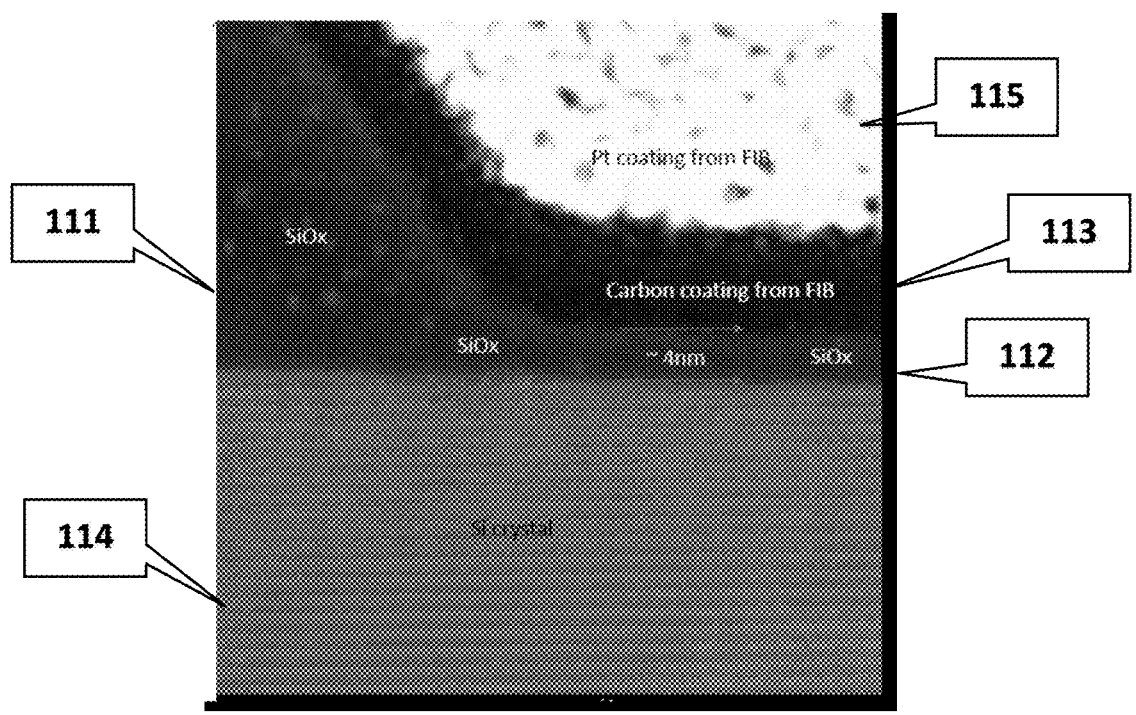
FIG. 11B is an image, at greater magnification, of the sample region outlined in the preceding figure. The silicon substrate, oxide layers, and carbon coating (for contrast) are labeled in the figure. A platinum coating, also added for contrast, is labeled in the figure.

FIG. 11B is an image, at greater magnification, of the sample region outlined in the preceding figure. The silicon substrate 114, oxide layers 111, 112, and carbon coating 113 (for contrast) are labeled in the figure. As indicated in the figure, the thin oxide layer is about 4 nm thick. A platinum coating 115, also added for contrast, is labeled in the figure. For comparison with the following figure, it should be borne in mind that in FIGS. 11A and 11B, the thick oxide is on the left and the thin oxide is on the right.

Figure 12A:
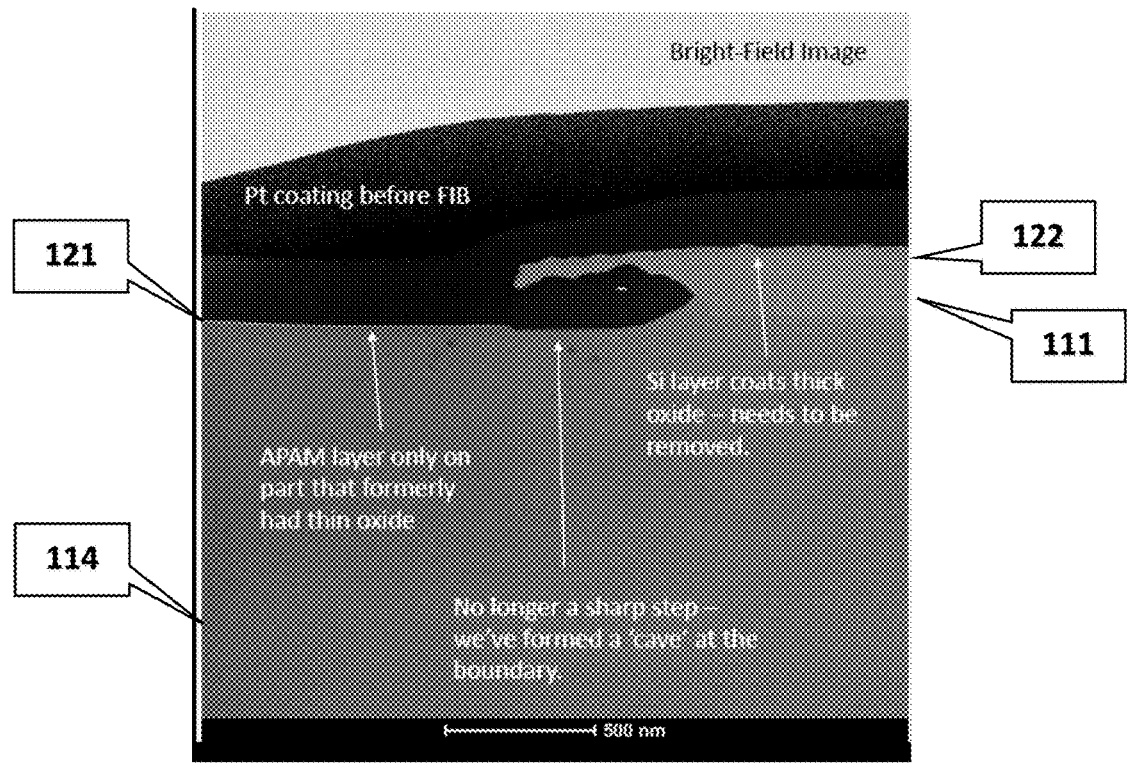
FIG. 12A is an image of a sample region after thermal treatment has removed the thin oxide layer, an APAM layer has been formed by exposure to phosphine and annealing, and the layer has been capped with a silicon layer. The image region is similar to the image region of FIG. 11A, and it is shown at comparable magnification. However, it should be noted that in FIG. 12A, the thick oxide is on the right, and the region from which the thin oxide was removed is on the left.

FIG. 12A is an image of a sample region after thermal treatment has removed the thin oxide layer, an APAM layer 121 has been formed by exposure to phosphine and annealing, and the layer has been capped with a silicon layer 122. The image region is similar to the image region of FIG. 11A, and it is shown at comparable magnification. However, it should be noted that in FIG. 12A, the thick oxide 111 is on the right, and the region from which the thin oxide was removed is on the left.

The silicon substrate material 114 appears as the medium gray region that fills the lower half of the image. Overlying the substrate material on the left is the APAM layer 121, which appears as a thin stripe in a darker shade of grey. A thin layer of native oxide is seen, in a lighter shade of grey, overlying the APAM layer.

On the right-hand side of the image, the thick oxide layer 111 is seen in a light shade of grey. Overlying it, also in a shade of grey, is a thin layer of silicon 122, which is labeled in the figure.

Figure 12B:
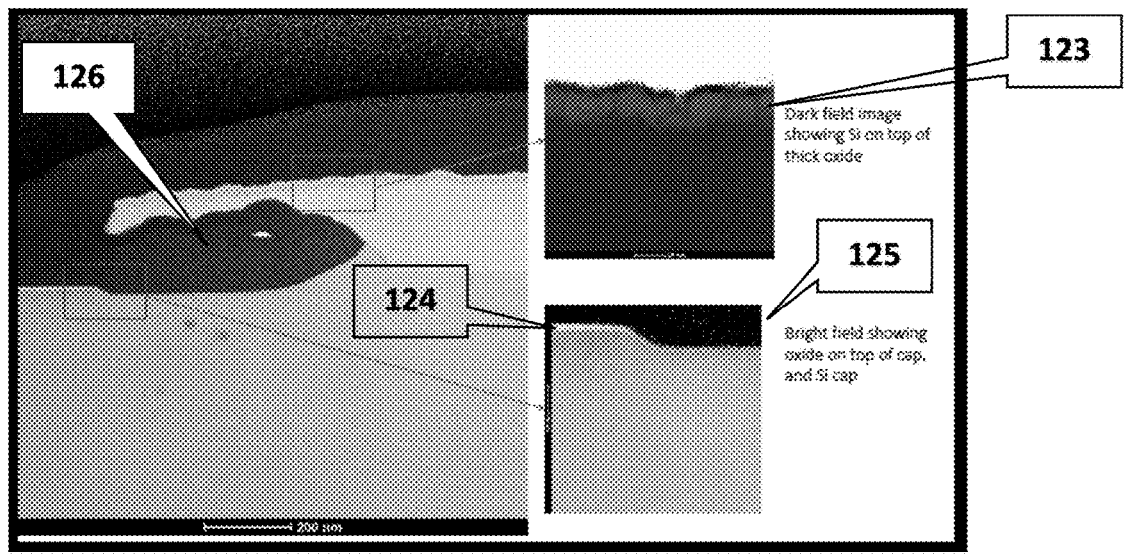
FIG. 12B shows a portion of the image of FIG. 12A at greater magnification. Two details of the main image are called out and shown at even greater magnification in respective insets. The upper inset is a dark field image showing with greater clarity the thin layer of silicon that overlies the thick oxide layer. The lower inset is a bright field image showing with greater clarity the silicon cap layer and a layer of oxide overlying the silicon cap.

FIG. 12B shows a portion of the image of FIG. 12A at greater magnification. Two details of the main image are called out and shown at even greater magnification in respective insets. The upper inset is a dark field image showing with greater clarity the thin layer 123 of silicon that overlies the thick oxide layer. The lower inset is a bright field image showing with greater clarity the silicon cap layer 124 and a layer of oxide 125 overlying the silicon cap.

In the center of the image, at the edge of the thick oxide layer proximate the APAM layer, it will be seen that a cavity 126 has been formed in the thick oxide, with a thin upper portion of the thick oxide jutting out over the cavity. Although not wishing to be limited by mechanism, we currently attribute the cavity formation to volatilization of silicon monoxide formed by the reaction between silicon and silicon dioxide. This may possibly be avoided by using other methods for oxide removal, such as sputtering or chemical mechanisms.

Upon examining the figure, it is important to note that as intended, the APAM layer has formed only in the region that had underlain the thin oxide mask layer.

FIG. 13 is an image showing a detail of a Hall measurement circuit at an intermediate stage of fabrication after deposition of the thin oxide but prior to oxide removal and doping. Accordingly, the foreground circuit features 131 correspond to thin oxide regions, and the background 132 corresponds to the thick oxide region. Two straight-line tracks are superimposed on the image. An atomic force microscope (AFM) was used to measure the surface topology of the sample along each of the two tracks. The resulting profilograms are shown in FIGS. 14A and 14B.

Turning to FIG. 14A, the trace shown there was taken along the upper track, i.e. track A, of FIG. 13. Turning to FIG. 14B, the trace shown there was taken along the lower track, i.e. track B, of FIG. 13. Both traces indicate a thin oxide thickness of about 200 nm on features with well-defined edges.

FIG. 15 is an image showing a detail of a Hall measurement circuit after formation of the APAM layer and deposition of the protective silicon cap layer. Two straight-line tracks labeled "A" and "B" are superimposed on the image. An atomic force microscope (AFM) was again used to measure the surface topology of the sample along each of the two tracks. The resulting profilograms are shown in FIGS. 16A and 16B.

Turning to FIG. 16A, the trace shown there was taken along the upper track, i.e. track A, of FIG. 15. Turning to FIG. 16B, the trace shown there was taken along the lower track, i.e. track B, of FIG. 15. Both traces indicate that the cap layer was deposited conformally, with a depression over the APAM layer that is about 200 nm deep in the center. It will be evident on examining the figures that the features in the APAM layer have a domed profile that dips by about 50 nm or more toward the edges. We attribute this to thermal removal of the oxide, which consumes silicon from the substrate at the silicon oxide to silicon boundary. Removal of the oxide by in-vacuum chemical etching or sputtering is expected to mitigate this effect.

Our Hall measurements gave a resistivity of 650 ohms per square, a carrier density of $0.8 \times 10^{14}$ cm-2, and a carrier mobility of 112 cm2/V-s. These values were within range of what was expected, given the doping conditions that were applied.

In the example described above, the substrate is silicon, the dopant is phosphorus, and the precursor gas is phosphine. However, these material choices should be understood only as non-limiting examples.

Semiconductor substrates are of particular interest because doping by the APAM technique opens a range of new possibilities for electronic devices. Silicon is the best-studied of the semiconductor substrates in this regard, but other possibilities include germanium, silicon-germanium alloys, and III-V compositions such as GaAs, InAs, InP, and GaN. Diamond is another possible substrate material that may be useful in this regard.

Phosphorus, arsenic, and boron are all dopants that may potentially be delivered using the techniques described here by using phosphine, arsine, and diborane or boron trichloride, respectively, as the precursor gases. This list should not be deemed to be exclusive, because any of various other dopants and precursors are also of interest in this regard. Alternative dopants may include aluminum, gallium, and antimony. Precursors for aluminum may include alane ($AlH_3$), aluminum trichloride, trimethylaluminum, and dimethyl aluminum hydride. Precursors for gallium and antimony may include triethylgallium and triphenylstibine, respectively.

Example 2

We performed trials to evaluate the use of neon sputtering to open a window in the silicon oxide hard mask. FIG. 17 is an STM topographical image, over a 50 nm×50 nm window, of the silicon surface within a window opened by room-temperature sputtering at an ion energy of 2 kV for 30 minutes at 60° incidence, followed by heating for 15 minutes to about 300° C., then heating to about 650° C. for 15 seconds. The appearance of silicon dimer rows in the image is evidence that the surface is suitable for APAM doping.

We took Hall measurements of carrier concentration and mobility on APAM-doped layers of dimensions 2 nm×6 nm, 5 nm×15 nm, and 10 nm×30 nm at 4° K. The respective measured carrier concentrations were 0.92, 0.95, and 0.95× 1014 cm-2. The respective measured mobilities were 56, 47, and 43 cm2V-1s-1. Caution is advisable in interpreting these measurements, because of possible geometrical effects. However, these results are at least comparable to results obtained from conventional APAM processing.

TEM images confirmed that the recrystallization process was adequate to enable growth of a crystalline epitaxial cap layer over a locking layer.

We claim:

1. A method of doping a substrate from a dopant precursor gas, comprising:
   covering a surface of the substrate with a hard mask;
   selectively removing material from the hard mask such that selected areas of the substrate surface are laid bare;
   exposing the laid-bare areas to the dopant precursor gas;
   heating the substrate so as to incorporate dopant from the dopant precursor gas into the substrate surface;
   forming a locking layer over the substrate surface by deposition followed by recrystallization; and
   epitaxially growing a cap layer of silicon over the substrate.

2. The method of claim 1, wherein the selective removal of material from the hard mask is performed by sputtering.

3. The method of claim 1, further comprising, after the selective removal of material from the hard mask, recrystallizing the surface of the substrate.

4. The method of claim 1, wherein the hard mask that covers the substrate surface has regions of greater thickness, here denominated thick regions, and regions of lesser thickness, here denominated thin regions.

5. The method of claim 4, wherein, in the step of selectively removing material, the substrate surface is laid bare beneath the thin regions but remains covered by the hard mask in the thick regions.

6. The method of claim 4, further comprising defining the thick and thin regions by lithographic patterning before material is selectively removed from the hard mask.

7. The method of claim 4, wherein the covering step comprises forming a first hard mask layer, selectively removing material from the first hard mask layer from regions designated as thin regions, and then forming a second hard mask layer at least in the thin regions.

8. The method of claim 7, wherein the second hard mask layer is oxidatively grown.

9. The method of claim 1, wherein the hard mask covering a surface of the substrate comprises silicon dioxide.

10. The method of claim 1, wherein the hard mask covering a surface of the substrate comprises silicon nitride or silicon oxynitride.

11. The method of claim 1, wherein the hard mask comprises at least two regions having different material compositions, and wherein the step of selectively removing material from the hard mask is performed, at least in part, such that one material composition of the hard mask is removed selectively, relative to at least one other material composition of the hard mask.

12. The method of claim 1, wherein the substrate comprises silicon.

13. The method of claim 1, wherein the substrate comprises germanium, a germanium-silicon alloy, gallium arsenide, indium arsenide, indium phosphide, or gallium nitride.

14. The method of claim 1, wherein the substrate comprises diamond.

15. The method of claim 1, wherein the dopant is phosphorus, and the exposing step comprises exposing the substrate surface to phosphine.

16. The method of claim 1, wherein the dopant is boron, and the exposing step comprises exposing the substrate surface to boron trichloride or diborane.

17. The method of claim 1, wherein:
   the dopant is arsenic, and the exposing step comprises exposing the substrate surface to arsine, or
   the dopant is gallium, and the exposing step comprises exposing the substrate surface to triethylgallium, or
   the dopant is antimony, and the exposing step comprises exposing the substrate surface to triphenylstibine.

18. The method of claim 1, wherein the dopant is aluminum, and the exposing step comprises exposing the substrate surface to alane, aluminum trichloride, trimethylaluminum, or dimethyl aluminum hydride.

* * * * *